US008003466B2

(12) United States Patent
Shi et al.

(10) Patent No.: US 8,003,466 B2
(45) Date of Patent: Aug. 23, 2011

(54) METHOD OF FORMING MULTIPLE FINS FOR A SEMICONDUCTOR DEVICE

(75) Inventors: Zhonghai Shi, Austin, TX (US); David Wu, Austin, TX (US); Jingrong Zhou, Austin, TX (US); Ruigang Li, Austin, TX (US)

(73) Assignee: Advanced Micro Devices, Inc., Austin, TX (US)

( * ) Notice: Subject to any disclaimer, the term of this patent is extended or adjusted under 35 U.S.C. 154(b) by 246 days.

(21) Appl. No.: 12/099,726

(22) Filed: Apr. 8, 2008

(65) Prior Publication Data

US 2009/0253238 A1 Oct. 8, 2009

(51) Int. Cl.

| | |
|---|---|
| ***H01L 21/336*** | (2006.01) |
| ***H01L 21/00*** | (2006.01) |
| ***H01L 21/84*** | (2006.01) |
| ***H01L 21/338*** | (2006.01) |
| ***H01L 21/8234*** | (2006.01) |
| ***H01L 21/3205*** | (2006.01) |
| ***H01L 21/4763*** | (2006.01) |
| *H01L 27/148* | (2006.01) |
| *H01L 29/66* | (2006.01) |
| *H01L 29/76* | (2006.01) |
| *H01L 21/12* | (2006.01) |
| *H01L 27/088* | (2006.01) |

(52) U.S. Cl. ........ 438/283; 438/149; 438/157; 438/176; 438/197; 438/585; 438/587; 257/241; 257/287; 257/288; 257/347; 257/401

(58) Field of Classification Search .................. 438/283
See application file for complete search history.

(56) References Cited

U.S. PATENT DOCUMENTS

| | | | | |
|---|---|---|---|---|
| 6,872,647 | B1 | 3/2005 | Yu et al. | |
| 6,921,963 | B2 | 7/2005 | Krivokapic et al. | |
| 7,508,031 | B2 * | 3/2009 | Liu et al. | 257/331 |
| 7,605,449 | B2 * | 10/2009 | Liu et al. | 257/622 |
| 7,807,523 | B2 * | 10/2010 | Liu et al. | 438/187 |
| 2005/0156171 | A1 * | 7/2005 | Brask et al. | 257/72 |
| 2006/0134868 | A1 * | 6/2006 | Yoon et al. | 438/283 |
| 2007/0001237 | A1 * | 1/2007 | King et al. | 257/401 |
| 2008/0296691 | A1 * | 12/2008 | Chuang et al. | 257/368 |

* cited by examiner

*Primary Examiner* — N Drew Richards
*Assistant Examiner* — Michael Jung
(74) *Attorney, Agent, or Firm* — Ingrassia Fisher & Lorenz, P.C.

(57) ABSTRACT

A fabrication process for a FinFET device is provided. The process begins by providing a semiconductor wafer having a layer of conductive material such as silicon. A whole-field arrangement of fins is then formed from the layer of conductive material. The whole-field arrangement of fins includes a plurality of conductive fins having a uniform pitch and a uniform fin thickness. Next, a cut mask is formed over the whole-field arrangement of fins. The cut mask selectively masks sections of the whole-field arrangement of fins with a layout that defines features for a plurality of FinFET devices. The cut mask is used to remove a portion of the whole-field arrangement of fins, the portion being unprotected by the cut mask. The resulting fin structures are used to complete the fabrication of the FinFET devices.

12 Claims, 6 Drawing Sheets

METHOD OF FORMING MULTIPLE FINS FOR A SEMICONDUCTOR DEVICE

TECHNICAL FIELD

Embodiments of the subject matter described herein relate generally to semiconductor devices and related manufacturing processes. More particularly, embodiments of the subject matter relate to methods of forming fins on a semiconductor device such as a FinFET device.

BACKGROUND

Transistors, such as metal oxide semiconductor field-effect transistors (MOSFETs), are the core building block of the vast majority of semiconductor devices. Some semiconductor devices, such as high performance processor devices, can include millions of transistors. For such devices, decreasing transistors size, and thus increasing transistor density, has traditionally been a high priority in the semiconductor manufacturing industry.

A FinFET is a type of transistor that can be fabricated using very small scale processes. FIG. 1 is a simplified perspective view of a FinFET 100, which is formed on a semiconductor wafer substrate 102. A FinFET is named for its use of one or more conductive fins (FinFET 100 includes only one fin 104). As shown in FIG. 1, fin 104 extends between a source region 106 and a drain region 108 of FinFET 100. FinFET 100 includes a gate structure 110 that is wrapped around fin 104. The dimensions of fin 104 wrapped by gate structure 110 determine the effective channel of FinFET 100. Fin thickness and length of the effective channel are critical to transistor characteristics. Consequently, the creation of fins having uniform dimensions can be an important aspect of the fabrication process.

FIG. 2 is a simplified perspective view of another FinFET 200; this particular version includes three fins 202 extending between a source region 204 and a drain region 206. As with FinFET 100, a gate structure 208 is formed across the three fins 202. When multiple fins are employed in this manner, it can be extremely important to maintain uniform fin thickness and uniform fin pitch (the distance between two adjacent fins, plus fin thickness). Such uniformity and controllability can be particularly difficult to achieve with conventional FinFET fabrication techniques, especially those that use very small process technologies (e.g., 32 nm or smaller).

BRIEF SUMMARY

A FinFET fabrication technique as described herein provides conductive fins having uniform dimensions, even when manufactured using small scale process technologies. The fabrication technique results in an arrangement of conductive fins having uniform fin thickness and uniform fin pitch.

The above and other aspects may be carried out by an embodiment of a method of manufacturing a semiconductor device. The method involves forming a conductive fin arrangement on a semiconductor wafer, the conductive fin arrangement comprising a plurality of conductive fins having a uniform pitch and a uniform fin thickness, and selectively removing a portion of the conductive fin arrangement to define conductive fin structures for a plurality of transistor devices.

The above and other aspects may be carried out by another embodiment of a method of manufacturing a semiconductor device. This method involves: providing a semiconductor wafer having a layer of conductive material; forming a whole-field arrangement of fins from the layer of conductive material, the whole-field arrangement of fins comprising a plurality of conductive fins having a uniform pitch and a uniform fin thickness; forming a cut mask over the whole-field arrangement of fins, the cut mask selectively masking sections of the whole-field arrangement of fins with a layout that defines features for a plurality of transistor devices; and removing a portion of the whole-field arrangement of fins, the portion being unprotected by the cut mask.

Yet another embodiment of a method of manufacturing a semiconductor device involves: forming a whole-field arrangement of fins on a semiconductor wafer, the whole-field arrangement of fins comprising a plurality of conductive fins; forming an arrangement of gate lines on the semiconductor wafer; forming a cut mask that selectively masks sections of the whole-field arrangement of fins, and selectively masks sections of the arrangement of gate lines, the cut mask having a layout that defines features for a plurality of transistor devices; and removing a portion of the whole-field arrangement of fins and a portion of the arrangement of gate lines, the portions being unprotected by the cut mask.

This summary is provided to introduce a selection of concepts in a simplified form that are further described below in the detailed description. This summary is not intended to identify key features or essential features of the claimed subject matter, nor is it intended to be used as an aid in determining the scope of the claimed subject matter.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures.

DETAILED DESCRIPTION

The following detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, brief summary or the following detailed description.

For the sake of brevity, conventional techniques related to semiconductor device fabrication may not be described in detail herein. Moreover, the various tasks and process steps described herein may be incorporated into a more comprehensive procedure or process having additional steps or functionality not described in detail herein. In particular, various steps in the manufacture of semiconductor transistor devices are well known and so, in the interest of brevity, many conventional steps will only be mentioned briefly herein or will be omitted entirely without providing the well known process details.

The techniques and technologies described herein may be utilized to fabricate MOS transistor devices, including NMOS transistor devices, PMOS transistor devices, and CMOS transistor devices. Although the term "MOS device" properly refers to a device having a metal gate electrode and an oxide gate insulator, that term will be used throughout to refer to any semiconductor device that includes a conductive gate electrode (whether metal or other conductive material) that is positioned over a gate insulator (whether oxide or other insulator) which, in turn, is positioned over a semiconductor substrate.

A variety of FinFET devices and related fabrication processes are known. For example, U.S. Pat. Nos. 6,872,647 and 6,921,963—both assigned to Advanced Micro Devices, Inc.—are related to FinFETs and processes for manufacturing FinFETs (the relevant content of these two patents is incorporated by reference herein). In accordance with the traditional manufacturing techniques described in these two patents, conductive fins in a FinFET device are formed on a device-by-device basis. In other words, the photolithography, etching, and other process steps are performed such that the individual fins are created for each respective transistor device. FinFET performance is dependent on the thickness and pitch of fins, and the thickness and pitch should be uniform and closely controlled during manufacturing. In this regard, fabricating FinFETs using modern semiconductor manufacturing processes (e.g., 32 nm and smaller technologies) can be challenging due to the importance of controlling the dimensions of the fins. The techniques and technologies described herein can be utilized to form fins having highly uniform features with improved variation control.

Figure 1:
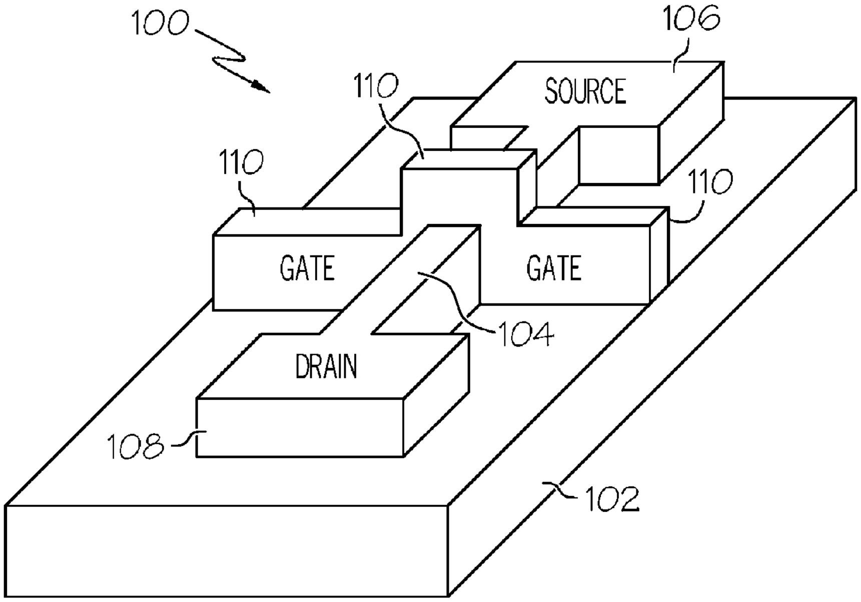
FIG. 1 is a simplified perspective view of a conventional FinFET.
Figure 2:
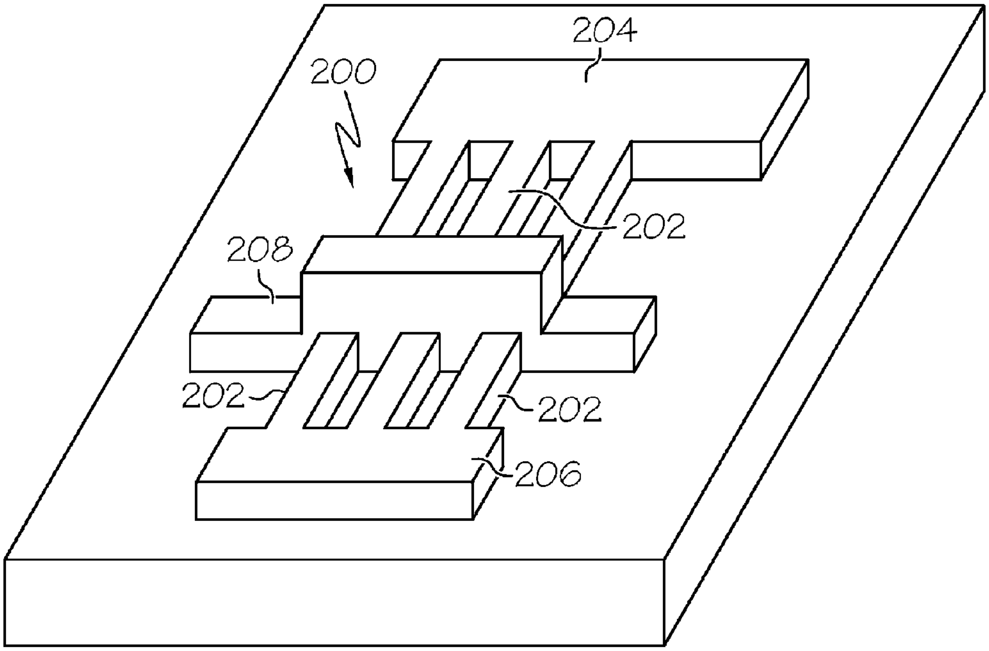
FIG. 2 is a simplified perspective view of a conventional FinFET having a plurality of fins.
Figure 3:
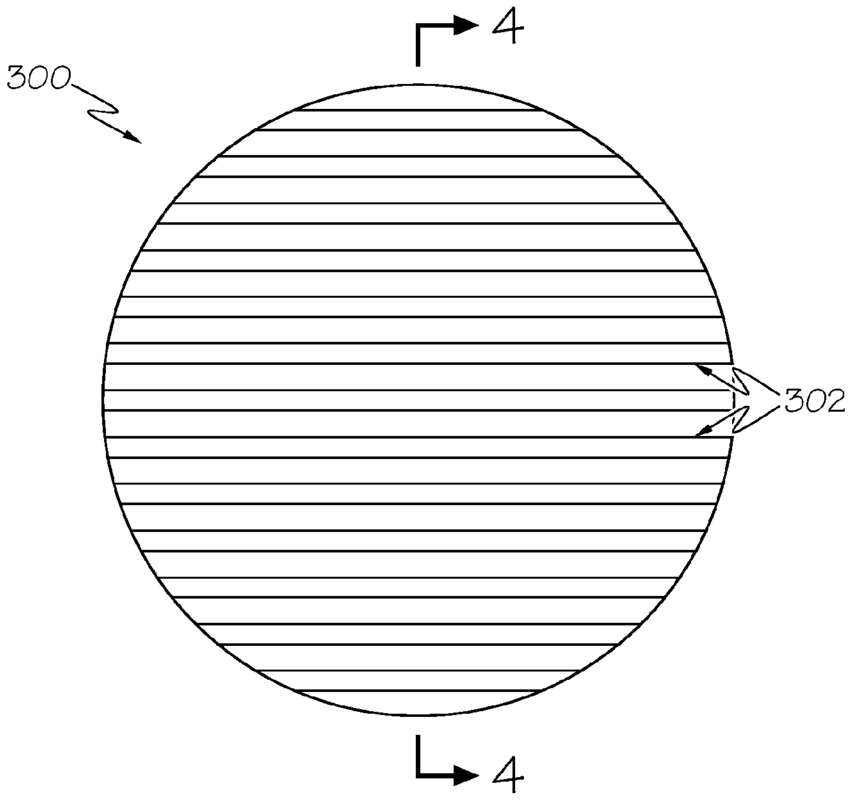
FIG. 3 is a top view of a wafer having formed thereon a whole-field arrangement of fins.
Figure 4:
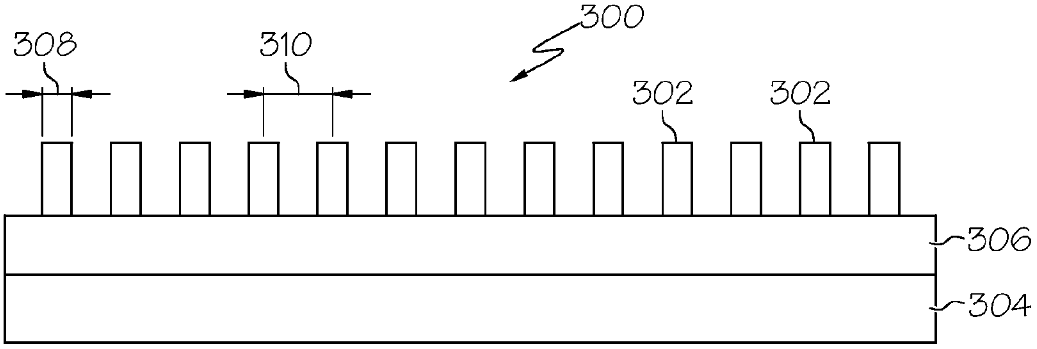
FIG. 4 is a cross sectional view of the wafer shown in FIG. 3.

FIG. 3 is a top view of a semiconductor wafer 300 having formed thereon a whole-field arrangement of fins 302, and FIG. 4 is a cross sectional view of semiconductor wafer 300 as viewed from line 4-4 in FIG. 3. As used herein, "whole-field" refers to the formation of consistent and uniform fins 302 over the entire surface of semiconductor wafer 300. In other words, as shown in FIG. 1, fins 302 span the entire surface of semiconductor wafer. The scale of fins 302 is exaggerated in FIG. 3 and FIG. 4 for ease of illustration. In practice, semiconductor wafer 300 may include an extremely large number of fins 302.

For this particular embodiment, semiconductor wafer 300 utilizes a silicon-on-insulator (SOI) structure. Referring to FIG. 4, semiconductor wafer 300 includes, without limitation, a support substrate 304, a buried oxide layer 306 formed on support substrate 304, and fins 302 formed on buried oxide layer 306. Support substrate 304 is preferably a silicon substrate, where the term "silicon substrate" is used herein to encompass the generally monocrystalline and relatively pure silicon materials typically used in the semiconductor industry. Support substrate 304 can be either N-type or P-type silicon, but is typically P-type. Here, buried oxide layer 306 and a layer of silicon above buried oxide layer 306 (from which fins 302 are fabricated) form what is commonly known as an SOI structure that, in turn, is supported by support substrate 304. For this embodiment, buried oxide layer 306 is a layer of oxide ($SiO_2$).

Both FIG. 3 and FIG. 4 illustrate an intermediate state in the fabrication process after the formation of fins 302 on semiconductor wafer 300. These fins 302 are formed using well known techniques and process steps (e.g., techniques and steps related to photolithography and patterning, etching, material growth, material deposition, surface planarization, and the like). Fins 302 are formed such that they have a uniform pitch and a uniform fin thickness. In FIG. 4, the arrows 308 represent the fin thickness and the arrows 310 represent the pitch between adjacent and neighboring fins 302. In some embodiments, the fin thickness can be within the range of about 10-60 nm, and the fin pitch can be within the range of about 50-300 nm. The manufacturing technique described herein results in uniform fin thickness (within practical tolerances) over the entire whole-field arrangement of fins 302, and results in uniform fin pitch (within practical tolerances) over the entire whole-field arrangement of fins 302. Such uniformity is desirable because the operating characteristics of the transistor devices that utilize fins 302 are dependent on the fin thickness and/or the fin pitch.

Figure 5:
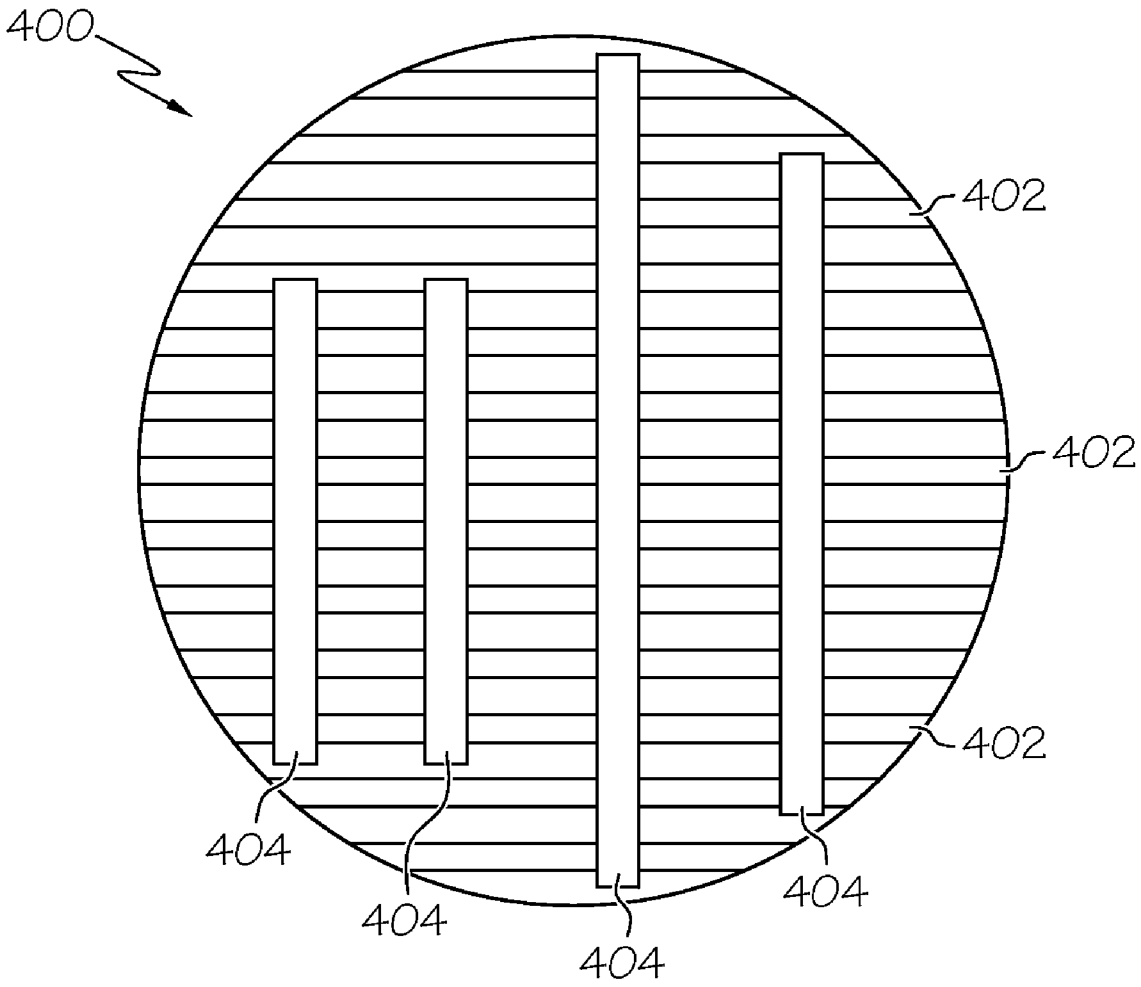
FIG. 5 is a top view of a wafer having formed thereon a whole-field arrangement of fins and an arrangement of gate lines.

FIG. 5 is a top view of a semiconductor wafer 400 having formed thereon a whole-field arrangement of fins 402 and an arrangement of gate lines 404. In FIG. 5, fins 402 are depicted as horizontal bars, while gate lines 404 are depicted as vertical bars. The scale of fins 402 and gate lines 404 is exaggerated in FIG. 5 for ease of illustration. In practice, semiconductor wafer 400 may include an extremely large number of fins 402 and an extremely large number of gate lines 404.

Wafer 400 represents an embodiment where the arrangement of gate lines 404 is formed on semiconductor wafer 400 after formation of fins 402, but before selective removal of any portion of fins 402. As described in more detail below, gate lines 404 are formed on the buried oxide layer (see FIG. 4 for reference) and over fins 402. The arrangement of gate lines 404 can be formed using known process steps and the particular composition of gate lines 404 and the manner in which gate lines 404 are formed will not be described in detail here. Indeed, FIG. 5 depicts gate lines 404 in a simplified manner; in practice, each gate line 404 can be realized as a stacked arrangement having, for example, a gate insulator such as an oxide, a gate metal (such as TiN, La, Er, Tb, Pt, Ni, Ir, Ru, $RuO_2$, $IrO_2$, TaCN, TaN, W, or WN), and polysilicon between the gate insulator and the gate metal. In some cases, the gate metal can be directly formed on the gate insulator without any intervening polysilicon.

Figure 6:
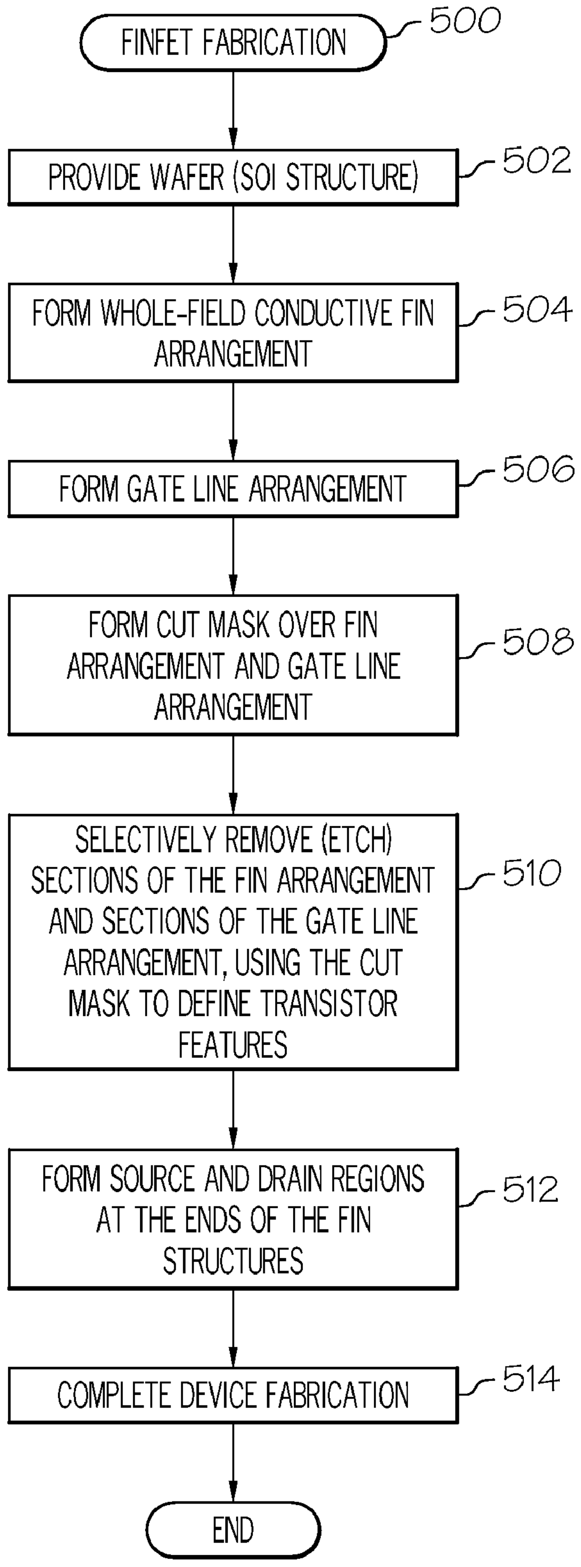
FIG. 6 is a flow chart that illustrates an embodiment of a FinFET fabrication process.

FIG. 6 is a flow chart that illustrates an embodiment of a FinFET fabrication process 500 that can be employed to form FinFET devices having uniform fin characteristics. Process 500 begins by providing a semiconductor wafer having a layer of conductive material (task 502). As mentioned above, a wafer having an SOI structure is appropriate for process 500. In such an embodiment, the layer of conductive material is a silicon-based material. Process 500 then forms a whole-field arrangement of conductive fins from the layer of conductive material (task 504). The formation of conductive fins across the entire surface of the wafer results in a plurality of conductive fins having a uniform pitch and a uniform fin thickness. Good uniformity can be achieved using modern lithographic techniques due to the creation of long and uninterrupted fins having consistent dimensions across the wafer. Since the fins are not divided into different distinct sections having different pitches and/or thicknesses, the uniformity can be better controlled. Referring again to FIG. 3, task 504 forms the silicon fins such that they span the entire surface of the wafer (or at least a significant portion of the surface). Ultimately, these fins can be used for any number of transistor-based devices.

Figure 7:
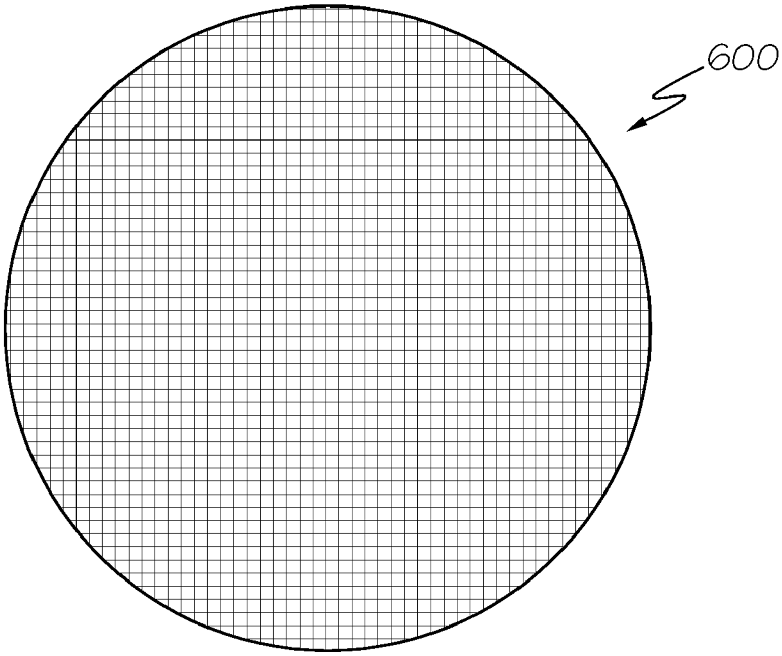
FIG. 7 is a top view of a wafer having formed thereon a whole-field arrangement of fins and an arrangement of gate lines.

This particular embodiment of FinFET fabrication process 500 forms an arrangement of gate lines (also referred to herein as a "gate arrangement") on the wafer after the formation of the conductive fins (task 506). As described previously, the gate arrangement includes a plurality of gate lines, which may ultimately be used for any number of transistor-based devices. FIG. 7 is a top view of a wafer 600 having formed thereon a whole-field arrangement of fins and a whole-field arrangement of gate lines (depicted as a highly dense crisscross pattern); FIG. 7 depicts an exemplary intermediate state that might result after the completion of task 506.

Figure 8:
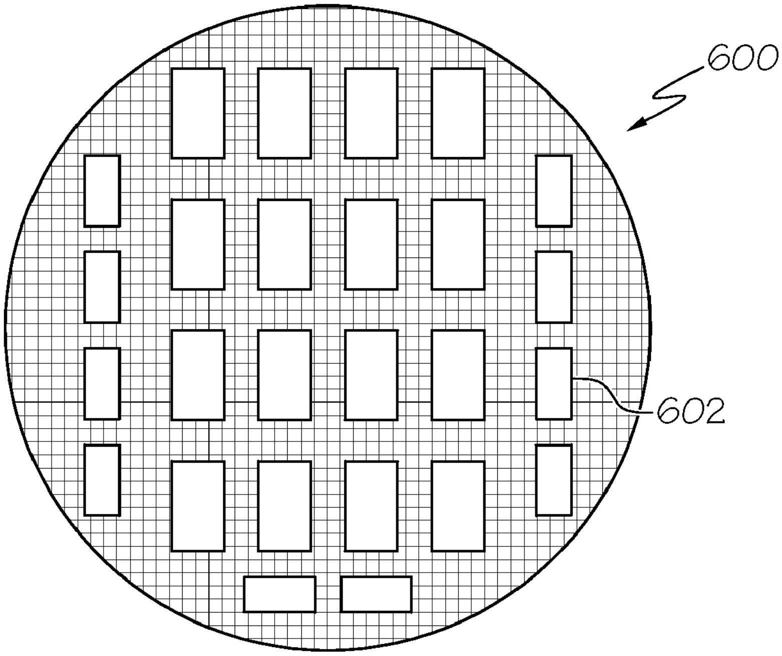
FIG. 8 is a top view of the wafer shown in FIG. 7, with a cut mask formed thereon.

After formation of the gate arrangement, FinFET fabrication process 500 forms a cut mask over the fins and, in this embodiment, over the gate arrangement (task 508). The cut mask selectively masks sections of the whole-field arrangement of fins with a layout that defines features for a plurality of transistor devices. In this embodiment, the cut mask also selectively masks sections of the gate arrangement. FIG. 8 is a top view of wafer 600, with a cut mask 602 formed thereon; FIG. 8 depicts an exemplary intermediate state that might result after the application of cut mask 602 on wafer 600.

Cut mask 602 is formed from a photoresist material using appropriate photoresist application and photolithography techniques. The photoresist layer is formed over wafer 600 using any suitable technique, for example, spin coating. Those skilled in the art will recognize that a positive or a negative photoresist material (and corresponding photolithography technique) can be used to form cut mask 602. The thickness and composition of the photoresist layer is selected in accordance with the desired process technology. The photoresist layer can comprise a variety of photoresist materials, compositions, or chemicals suitable for lithographic applications. After applying the photoresist layer on wafer 600, task 508 selectively exposes the photoresist layer, and then develops the exposed photoresist layer into the patterned cut mask 602.

In practice, cut mask 602 defines a layout or a pattern of protected and unprotected areas. Referring to FIG. 8, the rectangular regions of cut mask 602 represent protected areas, and the regions where the fins and the gate lines are exposed represent unprotected areas. For this example, each rectangular region corresponds to features that will eventually become part of a distinct semiconductor device, such as a transistor, an inverter, a NAND device, a NOR device, a multiplexer, or the like.

Although other fabrication steps or sub-processes may be performed after formation of cut mask 602, this example continues with an etching step, which may be associated with an isotropic etch technique, an anisotropic etch technique, or any suitable etch technique. In accordance with this embodiment, cut mask 602 is utilized to selectively remove the unprotected sections of the conductive fin arrangement, and to selectively remove the unprotected sections of the gate arrangement (task 510). In other words, task 510 removes unwanted or excess portions of the conductive fins and removes unwanted or excess portions of the gate lines. The selective removal of material defines conductive fin structures for a plurality of transistor devices, and defines gate line structures for a plurality of transistor devices. Notably, portions of the fin arrangement and portions of the gate arrangement can be concurrently removed during the same etching step.

Figure 9:
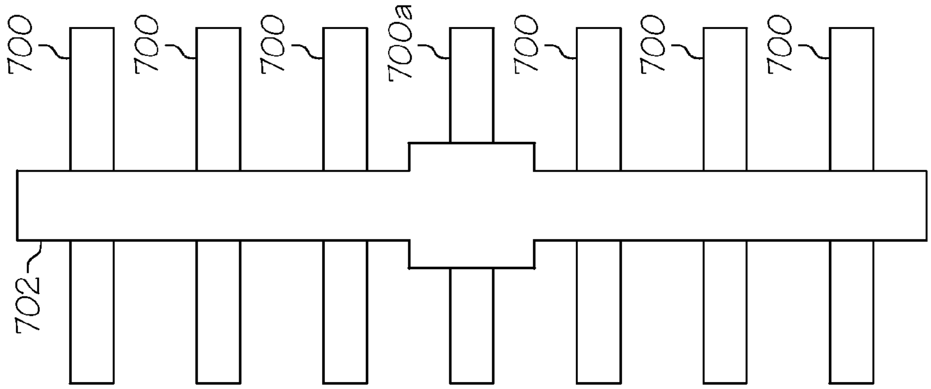
FIG. 9 is a schematic top view of fins and a gate line formed using a cut mask.

Cut mask 602 is suitably designed such that the desired configuration of fins and gate lines is achieved for each individual device. For example, the number of fins, the length of each fin, and the gate line layout can be created as needed. In this regard, FIG. 9 is a schematic top view of fins 700 and a gate line 702 formed using a cut mask as described above. Fins 700 and gate line 702 represent features/structures suitable for use in an exemplary semiconductor device such as a transistor or an inverter. Of course, FIG. 9 depicts only one of many possible layouts for semiconductor device features, and the embodiment shown in FIG. 9 is not intended to limit or restrict the scope or application of the subject matter described herein.

As shown in FIG. 9, the cut mask defined a region that includes seven parallel fins 700 having a uniform fin thickness and a uniform fin pitch. In addition, the cut mask defined gate line 702 such that it spans all seven fins 700. For this simplified embodiment, gate line 702 approximately bisects fins 700. FIG. 9 depicts an enlarged portion of gate line 702 that may be fabricated to accommodate a gate contact as described below. This contact area of gate line 702 can be fabricated during the formation of the arrangement of gate lines (prior to application of the cut mask). Notably, fin **700*a* (the center fin) is a dummy feature that remains unused in the finished device, as explained with reference to FIG. 10** below.

Referring again to FIG. 6, additional fabrication steps or sub-processes may be performed after etching the fins and the gate lines. For example, FinFET fabrication process 500 may form source and drain regions for various transistor-based devices (task 512). The source and drain regions are preferably formed at the opposite ends of the conductive fin structures. The source and drain regions can be formed using any number of known techniques and processes. As one non-limiting example, silicon material is formed at the ends of the fins, and the silicon material is patterned and etched to create the desired source and drain regions. In addition, a selective epitaxial process can be used to selectively fatten the source/drain regions to improve transistor performance.

Figure 10:
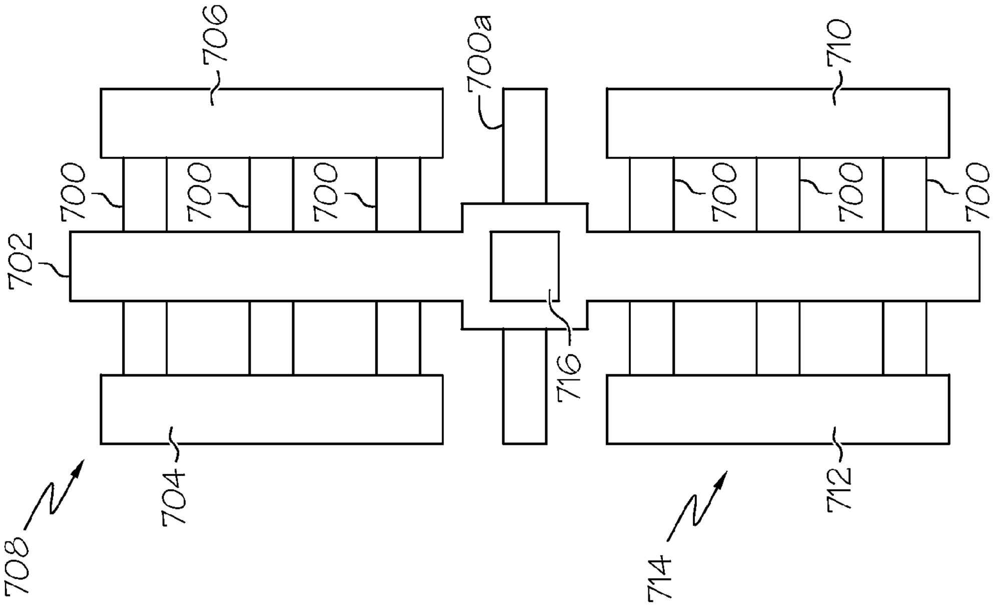
FIG. 10 is a schematic top view of the fins and gate line shown in FIG. 9, along with additional device features.

After the source and drain regions have been created, any number of known process steps can be performed to complete the fabrication of the semiconductor devices (task 514). For example, FIG. 10 is a schematic top view of the fins 700 and gate line 702 shown in FIG. 9, after formation of additional device features. FIG. 10 depicts an exemplary inverter structure that uses two transistor devices. FIG. 10 depicts a state after formation of a source contact 704 and a drain contact 706 for a first transistor 708, and a drain contact 710 and a source contact 712 for a second transistor 714. These source and drain contacts correspond to the respective source and drain regions created during task 512. FIG. 10 also shows a gate contact 716 formed on gate line 702. These contacts are formed from an appropriate material such as copper, tungsten, or other metal alloys. In practice, the contacts can be formed using etching, barrier layer deposition, tungsten fill, and polishing/planarizing process steps. For this embodiment, a conductive metal line is used to connect drain contact 706 to drain contact 710, and that common node serves as the output node of the inverter. A second conductive metal line is used to connect source contact 704 to a supply voltage (e.g., Vdd), and a third conductive metal line is used to connect source contact 712 to another supply voltage (e.g., Vss or ground). A fourth metal line is connected to gate contact 716. In certain embodiments, all of these metal lines are formed from the same metal layer, such as the metal one (M1) layer. These metal lines are omitted from FIG. 10 for the sake of simplicity and clarity.

The embodiment described above utilizes the cut mask after formation of the fin arrangement and the gate arrangement. Alternatively, the cut mask can be used before formation of the gate arrangement. In accordance with this alternate technique, the conductive fin structures are etched and defined before the gate lines are created. Although this alternate technique results in additional process steps related to the formation of the gate lines, using the cut mask to etch the whole-field arrangement of fins still results in improved fin uniformity.

As mentioned previously, FinFET fabrication process 500 may include additional and/or alternative process steps as needed to complete the manufacture of the semiconductor devices in the desired manner. It should be appreciated that any number of semiconductor devices having different layout orientations on a single wafer can be concurrently fabricated using the techniques and technologies described above.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. A method of manufacturing a semiconductor device, the method comprising:
   forming a conductive fin arrangement on a semiconductor wafer, the conductive fin arrangement comprising a plurality of conductive fins having a uniform pitch and a uniform fin thickness;
   after forming the conductive fin arrangement on the semiconductor wafer, forming a gate arrangement on the semiconductor wafer, the gate arrangement comprising a plurality of gate lines formed over the plurality of conductive fins; and
   after forming the gate arrangement on the semiconductor wafer, selectively removing a portion of the conductive fin arrangement to define conductive fin structures for a plurality of transistor devices, and a portion of the gate arrangement to define gate structures for the plurality of transistor devices.

2. The method of claim 1, wherein forming the conductive fin arrangement comprises forming the plurality of conductive fins such that they span an entire surface of the semiconductor wafer.

3. The method of claim 1, wherein forming the conductive fin arrangement comprises forming a plurality of silicon fins.

4. The method of claim 1, wherein selectively removing comprises forming a cut mask over the conductive fin arrangement and over the gate arrangement, the cut mask selectively masking sections of the conductive fin arrangement and sections of the gate arrangement with a layout corresponding to the conductive fin structures and the gate structures.

5. The method of claim 4, wherein selectively removing comprises etching sections of the conductive fin arrangement and sections of the gate arrangement that are unprotected by the cut mask.

6. The method of claim 1, further comprising forming source and drain regions at opposite ends of the conductive fin structures.

7. A method of manufacturing a semiconductor device, the method comprising:
   providing a semiconductor wafer having a layer of conductive material;
   forming a whole-field arrangement of fins from the layer of conductive material, the whole-field arrangement of fins comprising a plurality of conductive fins having a uniform pitch and a uniform fin thickness;
   after forming the whole-field arrangement of fins, forming an arrangement of gate lines on the semiconductor wafer and overlying the conductive fins;
   after forming the arrangement of gate lines on the semiconductor wafer, forming a cut mask over the whole-field arrangement of fins and over the arrangement of gate lines, the cut mask selectively masking sections of the whole-field arrangement of fins and sections of the arrangement of gate lines with a layout that defines features for a plurality of transistor devices;
   removing a first portion of the arrangement of gate lines to define gate structures for the plurality of transistor devices, the first portion being unprotected by the cut mask; and
   removing a second portion of the whole-field arrangement of fins, the second portion being unprotected by the cut mask.

8. The method of claim 7, wherein:
   removing the first portion of the whole-field arrangement of fins results in a plurality of fin structures for the transistor devices; and
   the method further comprises forming source and drain regions at opposite ends of the fin structures.

9. A method of manufacturing a semiconductor device, the method comprising:
   forming a whole-field arrangement of fins on a semiconductor wafer, the whole-field arrangement of fins comprising a plurality of conductive fins;
   after forming the whole-field arrangement of fins on the semiconductor wafer, forming an arrangement of gate lines on the semiconductor wafer and over the conductive fins;
   after forming the arrangement of gate lines on the semiconductor wafer, forming a cut mask that selectively masks sections of the whole-field arrangement of fins, and that selectively masks sections of the arrangement of gate lines, the cut mask having a layout that defines features for a plurality of transistor devices; and
   removing a portion of the whole-field arrangement of fins and a portion of the arrangement of gate lines, the portions being unprotected by the cut mask.

10. The method of claim 9, wherein the plurality of conductive fins have a uniform pitch and a uniform fin thickness.

11. The method of claim 9, wherein removing the portion of the whole-field arrangement of fins and the portion of the arrangement of gate lines comprises etching sections of the whole-field arrangement of fins and etching sections of the arrangement of gate lines that are unprotected by the cut mask.

12. The method of claim 9, wherein:

removing the portion of the whole-field arrangement of fins and the portion of the arrangement of gate lines results in a plurality of fin structures for the transistor devices; and the method further comprises forming source and drain regions at opposite ends of the fin structures.

* * * * *